US008855988B2

(12) United States Patent
Strobel et al.

(10) Patent No.: US 8,855,988 B2
(45) Date of Patent: Oct. 7, 2014

(54) METHOD AND SYSTEMS OF DETERMINING VIABLE HYDRAULIC FRACTURE SCENARIOS

(75) Inventors: Marshal A. Strobel, Houston, TX (US); Gustavo Carvajal, Aberdeenshire (GR); Michael Szatny, The Woodlands, TX (US)

(73) Assignee: Landmark Graphics Corporation, Houston, TX (US)

( * ) Notice: Subject to any disclaimer, the term of this patent is extended or adjusted under 35 U.S.C. 154(b) by 0 days.

(21) Appl. No.: 13/981,357

(22) PCT Filed: Feb. 23, 2011

(86) PCT No.: PCT/US2011/025800
§ 371 (c)(1),
(2), (4) Date: Jul. 24, 2013

(87) PCT Pub. No.: WO2012/115630
PCT Pub. Date: Aug. 30, 2012

(65) Prior Publication Data
US 2013/0304444 A1    Nov. 14, 2013

(51) Int. Cl.
G06G 7/48 (2006.01)
E21B 43/26 (2006.01)
G06F 17/50 (2006.01)

(52) U.S. Cl.
CPC ............ G06F 17/5009 (2013.01); E21B 43/26 (2013.01)
USPC .......................................................... 703/10

(58) Field of Classification Search
USPC .......................................................... 703/10
See application file for complete search history.

(56) References Cited

U.S. PATENT DOCUMENTS

| 6,098,021 A | 8/2000 | Tang et al. |
| 2005/0119911 A1 | 6/2005 | Ayan et al. |
| 2006/0155473 A1 | 7/2006 | Soliman et al. |
| 2007/0199721 A1 | 8/2007 | Givens et al. |
| 2009/0119082 A1 | 5/2009 | Fitzpatrick et al. |
| 2009/0125362 A1* | 5/2009 | Reid et al. .................. 705/8 |
| 2009/0235729 A1 | 9/2009 | Barthelemy et al. |
| 2009/0319243 A1 | 12/2009 | Suarez-Rivera et al. |
| 2010/0149917 A1 | 6/2010 | Imhof et al. |
| 2011/0022435 A1 | 1/2011 | Reid et al. |

OTHER PUBLICATIONS

Solares et al. (Efficient Technology Application to Optimize Deep Gas Well Completions in the Khuff and Jauf Formations Requiring Hydraulic Fracturing in Saudi Arabia), SPE 68206; 2001; pp. 1-7.*

(Continued)

*Primary Examiner* — Hugh Jones
(74) *Attorney, Agent, or Firm* — Conley Rose, P.C.

(57) ABSTRACT

Determining viable hydraulic fracture scenarios. At least some of the illustrative embodiments include: executing a fracture planning program, and determining a set of schedules from the fracture planning program, each schedule comprising a volume of fracture fluid, amount of proppant, and flow rate of the fracture fluid; providing each schedule of the set of schedules to a stress analysis program, executing the stress analysis program, and determining a set of indications from the stress analysis program, each indication indicative of whether a respect schedule exceeds engineering limits of a tubing string; and providing at least some of the schedules to a fracture simulation program, executing the fracture simulation program, and determining a set of fracture geometries from the fracture simulation program, each fracture geometry corresponding to a respective schedule.

8 Claims, 6 Drawing Sheets

(56) References Cited

OTHER PUBLICATIONS

Ruiz et al: Field-Development Case Study: Production Optimization Through Continuous Multidisciplinary Reservoir and Production Monitoring (SPE 103987); SPE Production & Operations Journal, vol. 23, No. 2, May 2008; pp. 249-256.*

McDaniel et al. (Limited-Entry Frac Applications on Long Intervals of Highly Deviated or Horizontal Wells; SPE 56780; Assignee) ; 1999; pp. 1-12.*

International Search Report and Written Opinion issued Nov. 25, 2011 in International Patent Application No. PCT/US2011/025800 filed Feb. 25, 2011, 11 pages.

Halliburton. Overview: AssetConnect (TM). 2011. Web. Http://www.halliburton.com/ps. Retrieved Feb. 4, 2011, 1 page.

Halliburton—Landmark Software and Services. AssetConnect (TM)—Technical Workflow Automation Software, Aug. 2010, 4 pages.

Halliburton. Workflow #1: Fracture Modeling and Optimization, May 2009, 21 pages.

Halliburton. Workflow #2: Reservoir Analysis Workflow, May 2009, 26 pages.

CARBO Ceramics. FracproPT—Fracture Stimulation Software, Fracture Modeling, 2010, Web Retrieved Feb. 14, 2011, 1 page.

Halliburton—Landmark Software and Services. AssetConnect (TM) Enterprise—Distributed Technical Workflow Automation Software, Aug. 2010, 2 pages.

Hallliburton—Production Enhancement. FracPac-N (SM) Fracture Design Service for High Perm Formations, Sep. 2009, 2 pages.

Halliburton—Landmark. Landmark Wellcat (TM) Software, Oct. 2008, 4 pages.

Petroleum Experts Ltd. IPM—Engineering Software Development, Sep. 2010, pp. 1-26.

Carvajal, G.A. et al. Holistic Automated Workflows for Reservoir and Production Optimization. SPE 130205. 2010, Society of Petroleum Engineers. SPE EUROPEC/EAGE Annual Conference and Exhibition; Barcelona, Spain; Jun. 14-17, 2010, pp. 1-12.

Szatny, M. Enabling Automated Workflows for Production. SPE 109859-PP. 2007, Society of Petroleum Engineers. SPE Annual Technical Conference and Exhibition; Anaheim, California; Nov. 11-14, 2007, pp. 1-4.

* cited by examiner

METHOD AND SYSTEMS OF DETERMINING VIABLE HYDRAULIC FRACTURE SCENARIOS

CROSS-REFERENCE TO RELATED APPLICATIONS

None.

BACKGROUND

The production of hydrocarbons from underground reservoirs is a highly complex operation, from the initial exploration using seismic data to the decisions on how to perform a hydraulic fracture of the formation surrounding a borehole sometime prior to production. This specification focuses on the latter—decisions regarding fracture of the formation (sometimes referred to singularly as a "completion", or plural "completions").

There are host of software tools available to the engineer charged with making decisions regarding completions. However, the software tools are "islands" to themselves, each performing a specific task in the overall series of steps to be performed, but not communicating, or not communicating well, with the software tools used before and/or after in the overall flow of work. For this reason, the task of selecting a completion for a borehole is a very time consuming task for the engineer. In fact, some experts estimate that around 70% of an engineer's time is spent coordinating data flows between software tools (i.e., gathering, formatting, and translating data for use by disparate software tools).

Thus, any advance which shortens the amount of time needed for an engineer to make a selection regarding completion, provides the engineer with non-intuitive information by way linking of separate software tools, or provides the engineer a broader array of completions from which to make a selection, would provide a competitive advantage in the marketplace.

BRIEF DESCRIPTION OF THE DRAWINGS

For a detailed description of exemplary embodiments, reference will now be made to the accompanying drawings in which.

NOTATION AND NOMENCLATURE

Certain terms are used throughout the following description and claims to refer to particular system components. As one skilled in the art will appreciate, different companies may refer to a component or actions by different names. This document does not intend to distinguish between components or actions that differ in name but not function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, through an indirect connection via other devices and connections.

The terms "program" and "software" are used throughout the specification and claims. Each of the terms "program" and "software" refer to executable computer code, groups of executable computer code, or computer code that can become or be used to create execute computer code. Particular components referred to as "programs" in this specification could equivalently be referred to as "software". Likewise, particular components referred to as "software" in this specification could equivalently be referred to as "programs". The terminology is adopted merely to help the reader distinguish different computer codes (or groups of computer code).

Detailed Description

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The various embodiments are directed to software tools which assist an engineer in making decisions regarding which completion to apply to a particular underground formation or portion of an underground formation. More particularly, the various embodiments are directed to methods, systems, and computer-readable media that increase the number of completion scenarios evaluated for a particular underground formation, and which may aid the engineer in selecting the most viable, in some cases economically viable, completion scenario.

Figure 1:
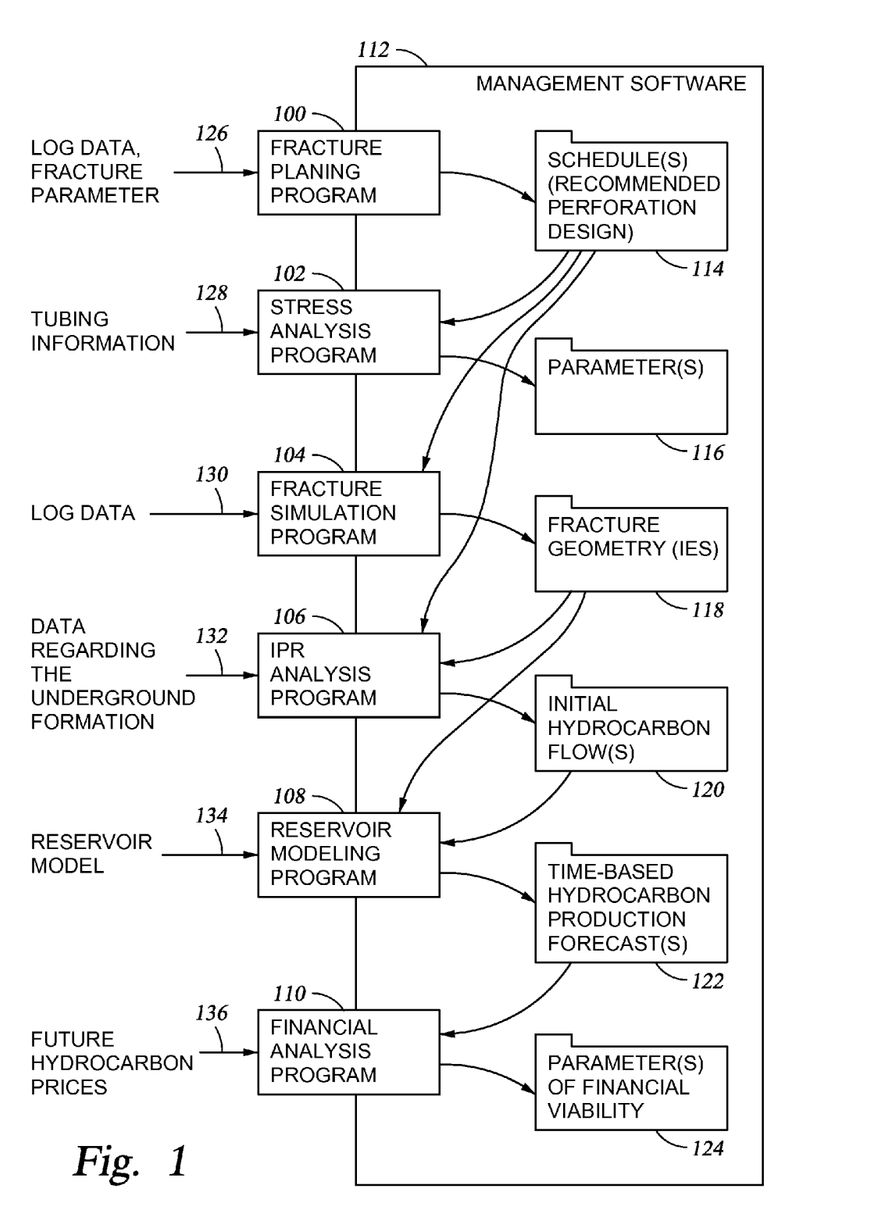
FIG. 1 graphically shows an illustrative set of programs used to make decisions in accordance with at least some embodiments.

FIG. 1 graphically shows an illustrative set of programs used to make decisions regarding completions in accordance with at least some embodiments. In particular, FIG. 1 shows a fracture planning program 100, a stress analysis program 102, a fracture simulation program 104, inflow performance relationship analysis program 106, numerical reservoir modeling program 108, financial analysis program 110, and management software 112. Each with be discussed in turn.

Fracture planning program 100 is an application that applies fracture design principles to a set of input data, and thereby creates either a single"schedule" or set of schedules 114 for a proposed fracture. The fracture planning program 100 may take input data such as: well log data (e.g., well log data in ".las" format); constituents of a proposed fracture (e.g., fluid type, proppant type); permeability of the formation to be fractured; and/or fluid efficiency range (i.e., an indication of the volume of fluid used to create or an fracture). Each schedule 114 is a proposed set of fracture parameters (e.g., volume of fracture fluid, amount of proppant, and flow rate for application of the fracture fluid). In some cases, a single schedule is produced based on a single set of input data, and in other cases the fracture planning program 100 produces multiple schedules for a single set of input data. The schedules 114 produced may take any suitable form, such as a text file, a file created using hyper-text markup language (HTML), or a file coded in a predefined schema such as extensible markup language (XML).

In a particular embodiment, the fracture planning program 100 is based on the software utilized in the FracPac-N$^{SM}$ brand service available from Halliburton Energy Services, Inc. of Houston, Tex. The software code utilized for the Frac-Pac-N$^{SM}$ brand service has the ability to create multiple schedules 114 based on selected fluid efficiencies provided in the input data. For example, a user may provide, as part of the input data, both a high and low efficiency range. The software code utilized for the FracPac-N$^{SM}$ brand service produces three fracture treatment outcomes or schedules 114 for a given volume of fluid and proppant with a known range: a low efficiency, reduced proppant design (i.e., smaller fracture geometry, reduced proppant placement); a low efficiency, increased proppant design (i.e., smaller fracture geometry, increased proppant placement); and a high efficiency, increased proppant design (i.e., larger fracture geometry, increased proppant placement). In yet other cases, if the high and low efficiency ranges are set equal, three identical schedules 114 are produced (this is effectively a single schedule from a data standpoint). Other fracture planning programs may be equivalently used.

In accordance with at least some embodiments, the fracture planning program 100 also calculates data regarding perforations of the casing (e.g., perforation lengths, entry hole diameter). The calculations regarding perforations are based on analytical pressure drop equations. Using the log parameters and formation fluid properties, and applying perforating skin pressure drop principles, enables calculation of a perforating geometry which can be supplied to the inflow performance relationship analysis program 106. In other embodiments, the perforating geometry can be calculated by other, stand alone, design optimization programs.

The next program in the illustrative system is the stress analysis program 102. The stress analysis program 102 is a program that calculates stress in downhole tubulars (e.g., work string tubulars, production tubulars, borehole casing), based on pressure, temperatures and flow rates. More particularly, the stress analysis program 102 may take as input data regarding the tubulars through which a proposed fracture will take place (e.g., number of tubulars, combined length, and wall thickness). The stress analysis program 102 produces, for each proposed fracture schedule 114, an indication 116 of whether the flows and/or pressures (in combination with other data, like expected downhole temperatures) of a proposed fracture schedule 104 exceeds engineering limits of the tubular string. Stated otherwise, the stress analysis program predicts whether the tubing string is capable of handling, without catastrophic failure, the pressures and/or flow rates for fracturing fluid with respect to a proposed schedule 114. It follows that if the stress analysis program 102 predicts a failure with respect to a particular schedule 104, the schedule is not a viable hydraulic fracture scenario. In some cases, the stress analysis program 102 takes a single schedule 114 (along with other data), and produces a single indication 116 of whether the flows and/or pressures exceed engineering limits. In such cases, the stress analysis program 102 may be invoked multiple times to create a set of indications 116 for a corresponding set of schedules 114. In other cases, the stress analysis program 102 may receive multiple schedules 114 in a single invocation, and thus produce a set of indications 116 corresponding to each respective schedule in a set of schedules 114. The indication or set of indications 116 may take any suitable form, such as a text file, a HTML file, or a XML file. Before proceeding, it is noted that, while illustrative FIG. 1 discusses invocation of programs in a particular order, the order may equivalently change. For example, the stress analysis program may be implemented after the fracture simulation program.

In a particular embodiment, the stress analysis program 102 is the WELLCAT™ brand program available from Landmark Graphics Corporation of Houston, Tex. The WELLCAT™ brand program is a suite of programs that perform engineering analysis for various phases of the creation of a borehole and production of hydrocarbons from the borehole. One illustrative of the components is the "PROD" design module. The PROD design module simulates fluid and heat transfer during completion, production, stimulation, testing, and well servicing operations. The software enables transient and steady-state analysis for single-phase and multiphase flow. Another of the components within the WELLCAT™ brand program is a component that performs stress analysis for tubulars, known as the "TUBE" design module. The TUBE design module analyzes tubing loads and movements, buckling behavior, and design integrity under complex mechanical, fluid pressure, and thermal loading conditions with standard and automatic load-case generation. The TUBE design model provides linked analyses with the PROD design module. For example, the TUBE design module of the WELLCAT™ brand program takes into account expected downhole temperature along with pressures within the tubulars, and can predict failures such as tubing collapse, buckling, triaxial (von Mises) stress failure, axial stress failure, and yield strength limit failures. Other stress analysis programs may be equivalently used.

The next program in the illustrative system is the fracture simulation program 104. The fracture simulation program 104 may take input data such as: rock properties of the formation to be fractured (e.g., Young's Modulus, permeability profile); length and orientation of borehole in the zone where fracturing is to take place; and/or one more schedules 114 produced by the fracture planning program 100. From the data provided, the fracture simulation program simulates or estimates the physical extent and dimensions of each proposed fracture scenario, referred to as "fracture geometry." That is, the fracture simulation program 104 may estimate the length, width, and height of fractures created under the conditions proposed in each schedule 114, and produce output data indicative of the three-dimensional fracture geometry that can be expected. In some cases, the fracture simulation program 104 takes a single schedule 114 (along with other data), and produces a fracture geometry 118. In such cases, the fracture analysis program 104 may be invoked multiple times to create a set fracture geometries 118 for a corresponding set of schedules 114. In other cases, the fracture analysis program 104 may receive multiple schedules 114 in a single invocation, and thus produce a set of fracture geometries 118 corresponding to each respective schedule in a set of schedules 114. The fracture geometry of set of fracture geometries 118 may take any suitable form, such as a gridded text file (e.g., a spreadsheet), a HTML file, or an XML file.

In a particular embodiment, the fracture simulation program 104 is the STIMPLAN™ brand program available from NSI Technologies, Inc. of Tulsa, Okla. Other fracture simulation programs 104 that may be equivalently used comprise FRACPRO PT™ brand programs available from Carbo Ceramics of Houston, Tex., and the GOHFER™ brand programs available from Barree & Associates, LLC of Houston, Tex.

Inflow performance relationship (IPR) analysis program 106 is a program that estimates an initial hydrocarbon flow rate at surface condition by taking into account the pressure drop in the total wellbore system from the reservoir to the surface facility. The pressure drop and rate may be influenced by factors such as restrictions to flow created by the tubing string. The IPR analysis program creates an initial hydrocarbon flow value or a set of initial hydrocarbon flow values 120. The IPR analysis program 106 may take input data such as: perforation geometry; fracture geometry; proposed casing perforation information; tubing size; and/or tubing length. Each hydrocarbon flow value 120 is an estimate of the hydrocarbon flow at the surface (e.g., oil flow, natural gas flow) based on Vertical Lift Performance (VLP) correlations in the program. In some cases, the fracture simulation program 104 takes a single fracture geometry 118 (along with other data), and produces a single initial hydrocarbon flow 120. In such cases, the IPR analysis program 106 may be invoked multiple times to create a set initial hydrocarbon flows 118 for a corresponding set of fracture geometries 118. In other cases, the IPR analysis program 106 may receive multiple fracture geometries 118 in a single invocation, and thus produce a set of initial hydrocarbon flow values 120 corresponding to each respective fracture geometry in a set of fracture geometries 118. The set of initial hydrocarbon flow values 120 may take any suitable form, such as text file, a HTML file, or XML file. In a particular case, the IPR analysis program 106 may enable more direct access to the set of initial hydrocarbon flow values 120 by way of an application programming interface (API) that enables other programs to "reach" directly into IPR analysis program 106 and extract desired data like the VLP tables and the production operating point.

In a particular embodiment, the IPR analysis program 106 is Prosper™ brand software available from Petroleum Experts, Ltd. of Edinburg Scotland, UK. Other inflow performance relationship analysis programs that may be equivalently used include: Well Evaluation Model (WEM) software available from P.E. Mosely & Associates, Inc. of Houston, Tex.; Pipesim™ brand software available from Schlumberger Limited of Houston, Tex.; and the Wellflo™ brand software available from Weatherford International Ltd. of Edinburg Scotland, UK.

Numerical reservoir modeling program 108 is a program that models or estimates time-based hydrocarbon flow from the underground formation (that is, models or estimates hydrocarbon flow over months or years) taking into account initial hydrocarbon multiflow rates, and thus creates either a single time-based hydrocarbon production flow or a set of time-based hydrocarbon production flows 122. The reservoir modeling program 108 may take as input data such as: fracture geometries; initial hydrocarbon flows; as well as a reservoir model (e.g., geo-cellular reservoir, structural geological framework, well log data with layer-by-layer formation properties, and/or formation data from other hydrocarbon producing boreholes in the formation). In some cases, the reservoir modeling program 108 takes a single fracture geometry 118, a related initial hydrocarbon flow 120, and produces a single time-based hydrocarbon production flow 122. In such cases, the reservoir modeling program 108 may be invoked multiple times to create a set time-based hydrocarbon production flows 122 for a corresponding multi-set of fracture geometries 118 and respective initial hydrocarbon flow rates 120. In other cases, the reservoir modeling program 108 may receive multiple fracture geometries 118 and respective multiple initial hydrocarbon flows 120 in a single invocation, and thus produce a set of time-based hydrocarbon production flows 122 corresponding to each respective fracture geometry and initial hydrocarbon flow. The set of time-based hydrocarbon production flows 122 may take any suitable form, such as text file, a HTML file, or a XML file.

In a particular embodiment, the reservoir modeling program 108 is the QuikLook™ brand products used by Halliburton Energy Services. Other reservoir simulation programs may be equivalently used, such as the Nexus® brand software available from Landmark Graphics Corporation, or the ECLIPSE™ brand software available from Schlumberger Limited.

Financial analysis program 110 analyzes financial viability of a proposed completion taking into account not only the cost of the proposed completion (both in outlay to perform the proposed completion, but also in some cases the time-based considerations (i.e., time value of money)), and thus creates either a single indication of financial viability or a set of indications of financial viability 124. The financial analysis program 110 may take input data such as: time-based hydrocarbon production flows 122; schedules 114; indications of time required for each step of each schedule; cost of each step of each schedule; daily cost of operations surrounding completions (e.g., drilling rig costs, overhead); and/or predicted hydrocarbon market values over time. In some cases, the financial analysis program 110 analyzes a single proposed completion (i.e., a single schedule along with a single time-based hydrocarbon production flow), and produces a single indication of financial viability 124. In such cases, the financial analysis program 110 may be invoked multiple times to create a set of indications of financial viability 124 for a corresponding set of schedules 114 and respective time-based hydrocarbon production flows 122. In other cases, the financial analysis program 110 may receive multiple schedules 114 and respective multiple time-based hydrocarbon production flows 122 in a single invocation, and thus produce a set of indications of financial viability 124 corresponding to each respective completion. The set of indications of financial viability 124 may take any suitable form, such as a gridded text file (e.g., a spreadsheet), a HTML file, or a XML file. In a particular embodiment, the financial analysis program 110 may be the Excel® brand software as part of the Microsoft® Office® suite of programs, available from Microsoft Corporation of Redmond, Wash. The ARIES™ brand program available from Landmark Graphics Corporation is another example of a financial analysis program. Other financial analysis programs may be equivalently used.

In the related art, an engineer responsible for selecting a particular completion to implement separately interfaces with each of the illustrative programs discussed above to arrive at a single completion. However, the interaction, and more particularly the movement of data between programs, is a time consuming task. More particularly, each program 100-110 may produce not only the desired information, but also a plethora of additional information that, while useful in some sense, is not necessarily used by the downstream program in the flow of work. For example, the IPR analysis program 106 may produce significantly more information than just initial hydrocarbon flow(s) at the surface. The IPR analysis program may produce additional data such as pressure drop at each point or node in the flow system, and indications relative concentrations of liquid and entrained gas at each node in the flow system, to name just a few. While such information may be ultimately useful, for purposes of determining or selection a completion to implement, such information is not necessarily needed, for example, such information is not necessarily needed by the financial analysis program 110. Thus, the engineer previously embarked on the time-consuming task of extracting and formatting information for the next phase of the flow of work. Because of the work involved in extracting and formatting data for movement between the analysis steps, an engineer practicing the related art may only evaluate a small handful of proposed completions (e.g., three).

In accordance with the various embodiments, the tasks associated with invoking each program 100-110 and moving data between the programs is handled by management software 112. In a particular embodiment, the engineer provides or otherwise makes available certain "static" data to the programs 100-110, and thereafter the management software 112 invokes each program, parses data, passes the parsed data to the next program, and invokes automatically the next program. More particularly still, the engineer may provide (as indicated by line 126) log data (e.g., log data in ".las" format) and parameters regarding hydraulic fracturing (e.g., fluid type, proppant) to the fracture planning program 100. The engineer may provide (as indicated by line 128) information regarding the tubing string through which the fracturing may take place to the stress analysis program 102. The engineer may provide (as indicated by line 130) the log data to the fracture simulation program 104. The engineer may provide (as indicated by line 132) data regarding the underground formation (e.g., rock type, permeability, hydrocarbon saturation) to the IPR analysis program 106. The engineer may provide (as indicated by line 134) an up-scaled geo-cellular reservoir model to the reservoir modeling program 108, where the reservoir modeling program 108 simulates hydrocarbon movement through the reservoir based on the model. The engineer may provide (as indicated by line 136) data regarding expected future prices per hydrocarbon unit (e.g., price per barrel, bank interest rate) to the financial analysis program 110. The various pieces of "static" data provided by the engineer are merely illustrative, and other static data may be equivalently provided. For example, other "static" parameters the engineer may provide may comprise: permeability of the formation; an indication of permeability anisotropy within the formation; porosity of the formation to be fractured; an indication of water saturation of the formation; Young's modulus for the formation to be fractured; an indication of horizontal stress in the formation; bottom hole pressure; bottom hole temperature; critical draw down (i.e., limits of reservoir pressure minus the reservoir flowing pressure at the wellbore/reservoir interface pressure drop cause by flow), drainage area of the reservoir; and/or fracturing fluid characteristics (e.g., non-Newtonian fluid characteristics).

Once static data is provided, the engineer may invoke the management software 112. The management software 112 is configured to perform the workflow to evaluate proposed completions, including invoking the various programs 100-110 in a desired order, parsing data provided by each program 100-110, and passing parsed data to the next program in the workflow. Still referring to FIG. 1, the management software 112 may invoke the fracture planning program 100 to produce the set of schedules 114. In some cases, the schedules 114 are produced directly, and in yet other cases the management software 112 is configured to parse data produced by the fracture planning program 100 to extract the data to produce the schedules 114. In cases where the fracture planning program 100 produces a single schedule, or produces data from which a single schedule 114 can be extracted, the management software 112 may invoke the fracture planning program 100 multiple times to produce a set of schedules 114.

Management software 112 may then provide or make available the set of schedules 114 to the stress analysis program 102, and then automatically invoke the stress analysis program 102 to produce the indications or parameters 116. In some cases, the indications 114 are produced directly, and in yet other cases the management software 112 is configured to parse data produced by the stress analysis program 102 to extract the data to produce the indications 116. In cases where the stress analysis program 102 produces a single indication, or produces data from which a single indication can be extracted, the management software 112 may invoke the stress analysis program 102 multiple times to produce a set of indications 114.

Management software 112 may then provide or make available the set of parameters 116 to the fracture simulation program 104, and then invoke the fracture simulation program 104 to produce the fracture geometries 118. In a particular embodiment, the management software 112 may cull from the set of schedules 114 any schedule whose respective indication 116 indicates that the schedule has a volume, flow, and/or pressure that exceeds engineering limits of the tubing string through which the proposed fracture would take place. In some cases, the fracture geometries 118 are produced directly by the fracture simulation program 104, and in yet other cases the management software 112 is configured to parse data produced by the fracture simulation program 104 to extract the data to produce the fracture geometries 118. In cases where the fracture simulation program 104 produces a single fracture geometry, or produces data from which a single fracture geometry can be extracted, the management software 112 may invoke the fracture simulation program 104 multiple times to produce a set of fracture geometries 118.

Management software 112 may then provide or make available the set of fracture geometries 118 to the IPR analysis program 106, and then automatically invoke the IPR analysis program 106 to produce the initial hydrocarbon flows 120. In some cases, the initial hydrocarbon flows 120 are produced directly by the IPR analysis program 106, and in yet other cases the management software 112 is configured to parse data produced by the IPR analysis program 106 to extract the data to produce the initial hydrocarbon flows 120. In cases where the IPR analysis program 106 produces a single initial hydrocarbon flow, or produces data from which a single hydrocarbon flow can be extracted, the management software 112 may invoke the IPR analysis program 106 multiple times to produce a set of initial hydrocarbon flows 120.

Management software 112 may then provide or make available the set of initial hydrocarbon flows 120, as well as the set of fracture geometries 118, to the reservoir modeling program 108, and then invoke the reservoir modeling program 108 to produce the time-based hydrocarbon production forecasts 122. In some cases, the time-based hydrocarbon production forecasts 122 are produced directly by the reservoir modeling program 108, and in yet other cases the management software 112 is configured to parse data produced by the reservoir modeling program 108 to extract the data to produce the time-based hydrocarbon production flows 122. In cases where the reservoir modeling program 108 produces a single time-based hydrocarbon production flow, or produces data from which a single time-based hydrocarbon production flow can be extracted, the management software 112 may invoke the reservoir modeling program 108 multiple times to produce a set of time-based hydrocarbon production flows 122.

Management software 112 may then provide or make available the set of time-based hydrocarbon production forecasts 122, and then invoke the financial analysis program 110 to produce the indications or parameters of financial viability 124. In some cases, the parameters of financial viability 124 are produced directly by financial analysis program 110, and in yet other cases the management software 112 is configured to parse data produced by the financial analysis program 110 to extract the data to produce the parameters of financial viability 124. In cases where the financial analysis program 110 produces a single parameter of financial viability, the management software 112 may invoke the financial analysis program 110 multiple times to produce a set of parameters of financial viability 124.

In some embodiments, the management software 112 may then provide the parameters of financial viability 124 to the engineer, from which the engineer can select the completion. Because of the time savings associated with using management software 112 to coordinate the workflow as between the various programs 100-110, an engineer may be able to evaluate a significantly greater number of possible completions than in cases where some or all of the workflow as between the programs 100-110 is manually controlled by the engineer. For example, in the same period of time when only three proposed completions can be evaluated without the assistance of the management software 112, an engineer may be able to evaluate three thousand (3000) or more proposed completions. It is noted that the "evaluation" need not turn strictly on the proposed completions that have an indication of financial viability, and schedules that propose fracturing parameters that exceed the engineering limits of the tubing (i.e., those schedules rejected based on the parameters 116 from the stress analysis program 102) are still considered evaluated.

In some embodiments, the parameters of financial viability may be indications of net present value (NPV) or net present worth (NPW). Net present value is a numerical value created based on the timing and size of expected capital outlays, and timing and size of income, with each adjusted to "present value" (i.e., taking into account the time value of money, though the "present" value may be calculated with respect to future date). Thus, for a set of indications of financial viability in the form of net present values, the engineer may select a completion having a more favorable net present value, or a completion whose net present value turns positive earlier in the life of the well. In some cases, the proposed completion with the maximum net present value or earliest positive net present value is selected, but in other cases a completion with a less favorable net present value may be selected (e.g., highest net present value may be from a completion with greater financial risk, like a massive hydraulic fracturing treatment requiring proprietary downhole tools with higher upfront costs).

Figure 2:
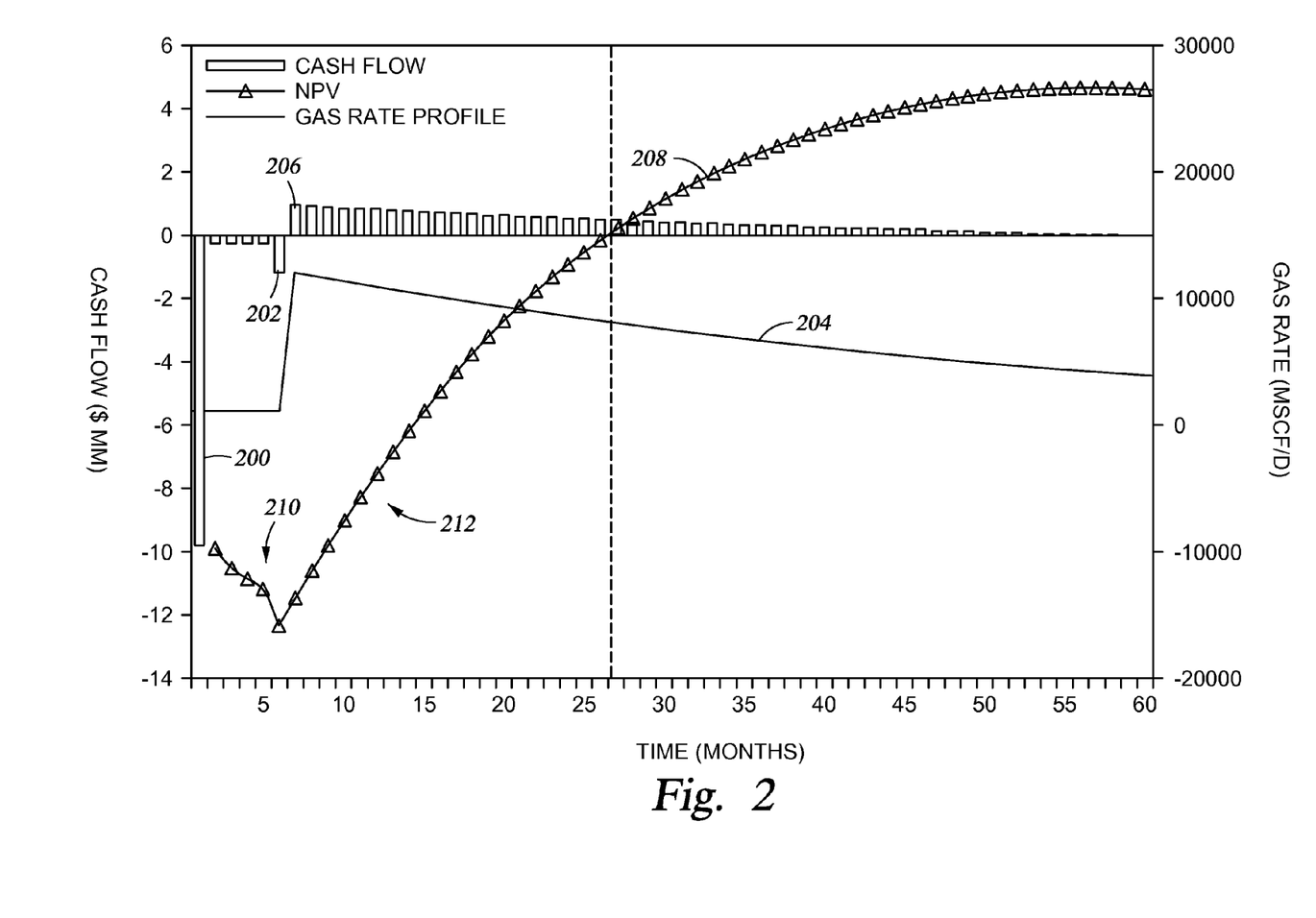
FIG. 2 shows a plot of data to illustrate at least some embodiments.

FIG. 2 shows an illustrative graph comprising parameters of financial viability, and also comprising underlying data from which parameters of financial viability may be calculated. In particular, FIG. 2 shows, by way of vertical bars, cash flow (plotted against the left vertical axis) for a drilling and production from a hypothetical borehole. In the example, for the first six months the cash flow is negative, with the greatest outlays being the cash outlay 200 in the first month and cash outlay 202 in the sixth month. The cash outlay 200 in the first month most likely indicates costs of placement of the drilling rig and associated equipment, and the cash outlay in the 202 in the sixth month associated with completion costs. Once the hypothetical borehole begins producing hydrocarbon in the seventh month, cash flow becomes positive, starting with cash inflow 206. Thereafter, the cash inflow (line 204) is directly proportional to the cumulated hydrocarbon production. FIG. 2 also shows a series of net present value indications, each net present value indicated by a triangle, and considered together the net present value indications form line 208. Each illustrative net present value indication represents the net "present" value for that time period. During periods of time during which only cash outlays are occurring, the net present value line trends downward (section 210). However, during periods of time after the hydrocarbons are being produced, the net present value line trends upward (section 212). In the illustrative situation of FIG. 2, the net present value goes positive in month 27, and asymptotically approaches its final value in the later months.

Thus, one illustrative parameter of financial viability that may be evaluated is the month at which the net present value becomes positive, with completions having a first positive net present value earlier being more desirable. In other cases, the indication of financial viability that may be evaluated is the highest net present value over the life of the evaluation. Thus, even though a particular completion may result in a later period of time at which the first positive net present value occurs, the long term value of the completion may be higher, and thus may be selected as the completion actually implemented.

In other embodiments, the parameter of financial viability may be an indication of return on investment (ROI) or rate of return (ROR). Return on investment is a numerical value that relates money gained or lost to the amount of money invested. Thus, for a set of parameters of financial viability in the form of return on investment, the engineer may select a completion having a more favorable return on investment. In some cases, the proposed completion with the maximum return on investment is selected, but in other cases a completion with a less favorable net present value may be selected taking into account other, in some cases non-monetary, considerations.

The various embodiments discussed to this point are based on the management software 112 executing the workflow in an open-loop sense. That is, the workflow is started and proceeds to the end, where the results are presented. However, in yet still further embodiments the management software 112 may repeat some or all of the workflow to evaluate an objective function. For example, in a particular embodiment the management software 112 executes the workflow multiple times until a set of parameters of financial viability meet a predetermined criteria. That is, the management software may itself evaluate the parameters of financial viability 124 and an objective function, and if the parameters do not meet a predetermined criterion, or if enough of the parameters do not meet the predetermined criteria, the management software 112 may again perform some all of the workflow. In some cases, the management software 112 may again perform the workflow starting with the fracture planning program 100, but with an adjusted set of parameters (e.g., different fracturing fluid, different efficiency variables). In other cases, the management software 112 may resume the workflow at any suitable point, such as the stress analysis program 102 (e.g., based on changed parameters regarding the tubing string through which the fracturing fluid will be pumped into the borehole). In such cases, the management software 112 may produce an indication of a single completion being the most favorable, or a small group of proposed completions, while effectively evaluating several thousand possible proposed completions. In a particular embodiment, the management software 112 is AssetConnect™ brand software available from Landmark Graphics Corporation. The AssetConnect™ brand software can use optimization routines, such as Latin hypercube sampling, optimal Latin hypercube sampling, orthogonal array sampling, and/or parameter study sampling to help generate and/or evaluate one or more objective functions to arrive at a single or small group of proposed completions. Other software with similar functionality, and which may be configured to operate as discussed herein, may be equivalently used.

The workflow illustrated by FIG. 1 is implicitly based on a single fracture zone in the borehole, and is presented in the fashion of FIG. 1 to simultaneously show an example workflow, illustrative interactions of the engineer with the various programs, and the interactions of the various programs 100-

110 with the management software 112. However, the manner of presentation of illustrative FIG. 1 is not explicit regarding a level of functionality provided in some embodiments. In a particular embodiment, the workflow orchestrated by the management software 112 includes not only evaluating with respect to a single fracture zone, but also evaluating completion types across multiple fracture zones in the same borehole.

Figure 3:
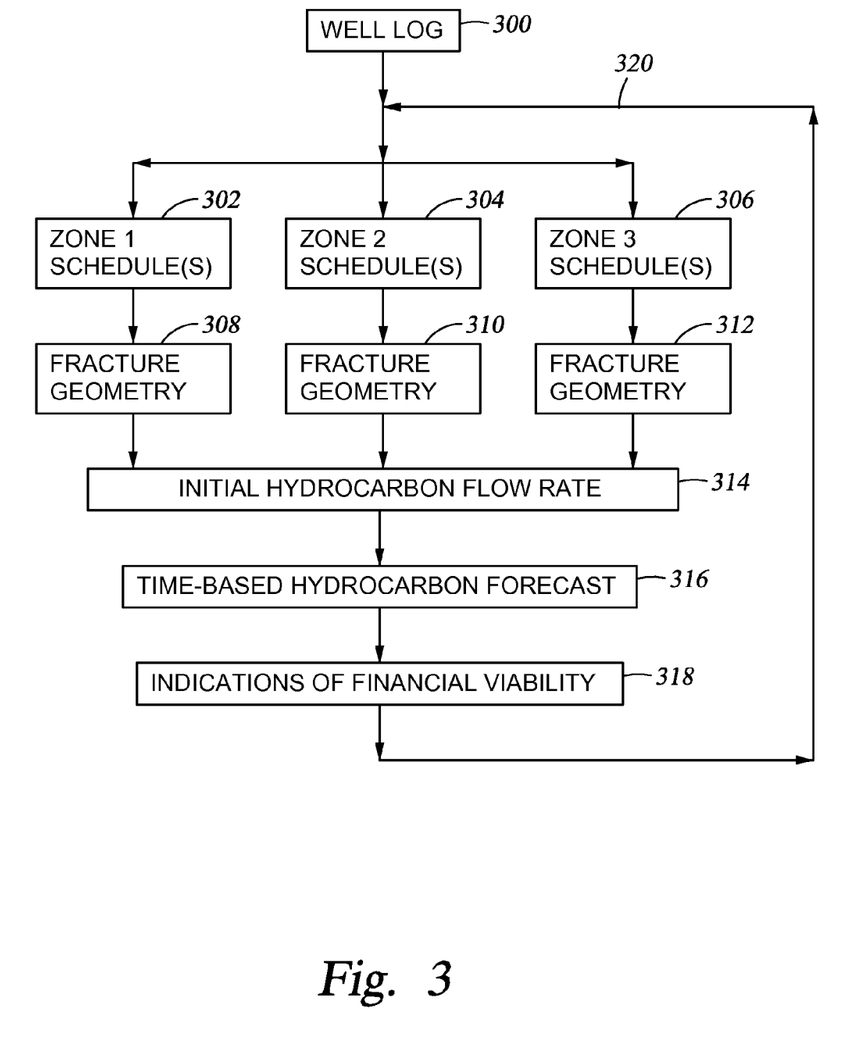
FIG. 3 shows, in block diagram form, operation of at least some embodiments.

FIG. 3 shows a block diagram to illustrate the workflow orchestrated by the management software 112 in accordance with embodiments having multiple zones, in this example three zones. In particular, FIG. 3 shows a well log 300, which well log is illustrative of the set of parameters which may be provided to the fracture planning program 100. Other parameters may also be provided. From the well log and other data, the fracture planning program 100 may produce schedules, and as illustrated the fracture planning program 100 produces schedules 302, 304 and 306 for respective zones. From the schedules 302, 304, and 306, the management software 112 invokes the fracture simulation program 104 to create respective fracture geometries 308, 310, and 312. Though not expressly indicated, in the event that if a schedule for a particular zone or zones exceeds engineering limits (i.e., the test performed by the stress analysis program 102) such schedules may not be passed to the fracture simulation program 104.

Based on the fracture geometries 308, 310, and 312, the management software 112 then invokes the IPR analysis program 106 to create the initial hydrocarbon flow rate 314, which in some cases includes both the flow rate for oil, water and gas. In the example situation of FIG. 3, it is assumed that the initial hydrocarbon flow rates from each respective fracture zone affect each other (e.g., a zone with higher producing pressure reduces flow from a zone with lower pressure), and thus a single initial hydrocarbon flow rate 314 is created that takes into account all three illustrative zones. From there, the management software 112 invokes the reservoir simulation program 108 to create the time-based hydrocarbon flow 316. Here again, it is assumed that hydrocarbon production flows from each respective fracture zone affect each other, and thus a single time-based hydrocarbon forecast 316 is created that takes into account all three illustrative zones. From there, the management software 112 invokes the financial analysis program 110 to create indications of financial viability 318.

The multiple zone analysis illustrated by FIG. 3 shows repeating some or all the analysis (by way of line 320). That is, the analysis for multiple zones may take several iterations, with parameters changing within particular zones. It may be that the best economic set of completions for the overall borehole may involve different types of fracturing in the different zones. For example, because of the interplay of pressure of the various zones feeding a single production tubing, the best economic set of completions may involve more aggressive fracturing for the zones of larger reservoir height, and performing an analysis by way of management software 112 may reveal such a fact. In the related art, an engineer simply may not have the time to perform the various permutations across multiple fracture zones to enable such a comparison.

As discussed above, some fracture planning programs 100 have the ability to produce multiple schedules. Embodiments illustrated by FIG. 3 may thus comprise multiple (e.g., three) schedules for each fracture zone. For example, the zone 1 schedule(s) 302 may comprise three schedules, the zone 2 schedule(s) 304 may comprise three schedules, and the zone 3 schedule(s) 306 may comprise three schedules (nine schedules for an illustrative three fracture zones). Each schedule produces a fracture geometry, and thus the various permutations of the fracture geometries may be evaluated by the management software 112 in a single "loop", with the number of permutations considered increasing somewhat exponentially if the analysis is repeated. Here again, the number of possible scenarios that may be evaluated by an engineer within a fixed period of time, over the number possible in the manual operation, is enormous. The result is that completions ultimately selected may be combinations an engineer would not have considered trying with a limited amount of time to make the determination.

There are several programs and software packages that interact to enable the various embodiments. In some cases, each program and/or software executes on its own computer system, such as a server computer system, with the interaction occurring by way of network (e.g., local area network (LAN), wide area network (WAN), across the Internet). Thus, there may be significant physical distances between the computer systems on which the various tasks are performed. In other cases, two or more programs and/or software packages may execute on the same computer system. Further still, some or all of the programs and/or software packages may execute in a "cloud" computing environment, which "cloud" computing environment may be a group of remote server systems which share work load dynamically.

Figure 4:
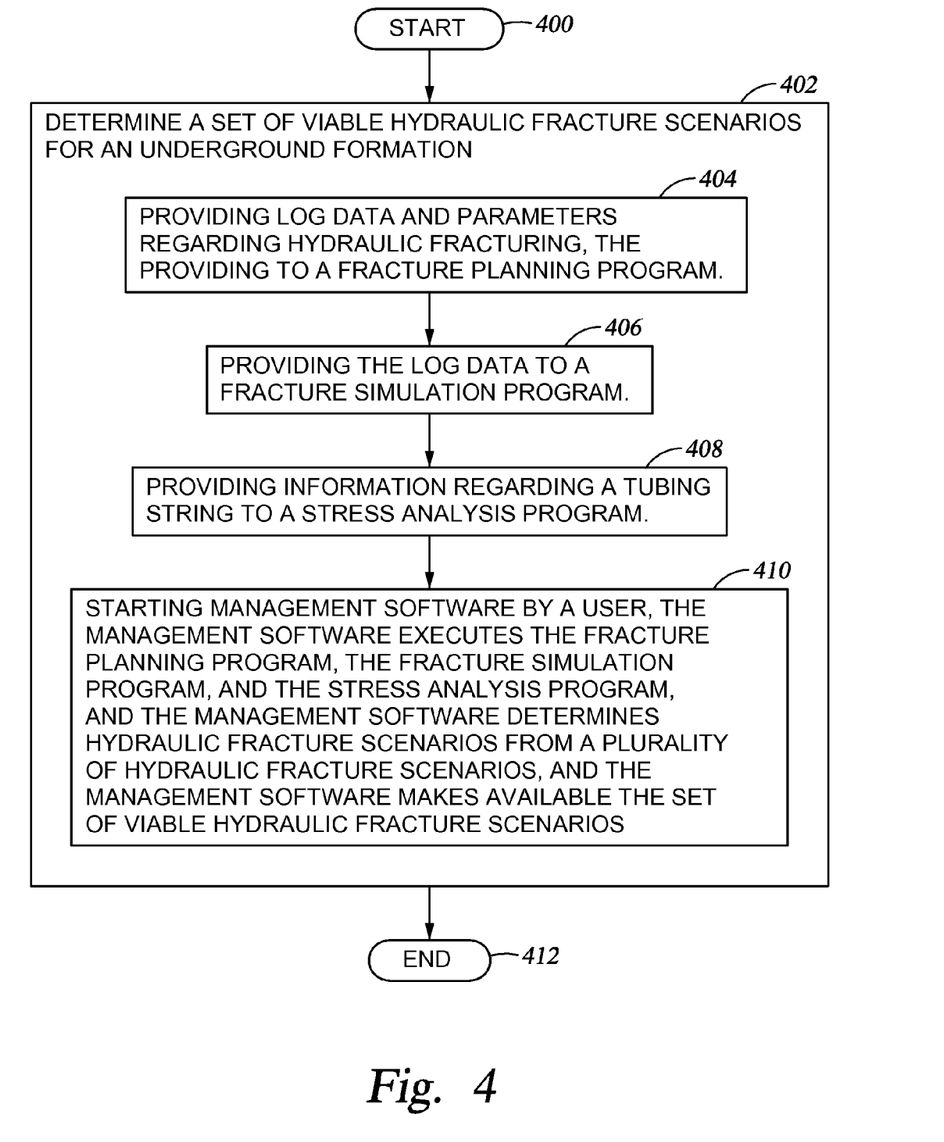
FIG. 4 shows a method in accordance with at least some embodiments.

FIG. 4 shows a method in accordance with at least some embodiments. In particular, the method starts (block 400) and proceeds to determining a set of viable hydraulic fracture scenarios for an underground formation (block 402). In some cases, the determining may comprise: providing log data and parameters regarding hydraulic fracturing, the providing to a fracture planning program (block 404); providing the log data to a fracture simulation program (block 406); providing information regarding a tubing string to a stress analysis program (block 408); and starting management software by a user, the management software automatically executes the fracture planning program, the fracture simulation program, and the stress analysis program, and the management software determines hydraulic fracture scenarios from a plurality of hydraulic fracture scenarios, and the management software makes available the set of viable hydraulic fracture scenarios (block 410). Thereafter, the method ends (block 412).

Figure 5:
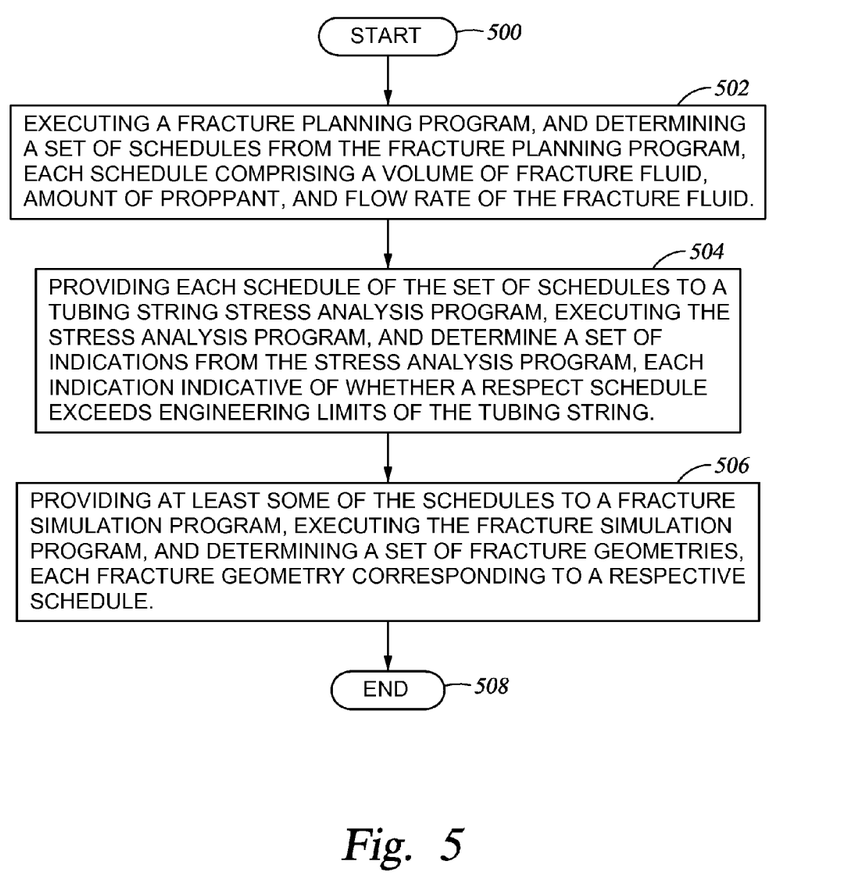
FIG. 5 shows a method in accordance with at least some embodiments.

FIG. 5 shows a method (that may be implemented in software) in accordance with at least some embodiments. In particular, the method starts (block 500) comprises: executing a fracture planning program, and automatically determining a set of schedules from the fracture planning program, each schedule comprising a volume of fracture fluid, amount of proppant, and flow rate of the fracture fluid (block 502); providing each schedule of the set of schedules to a tubing string stress analysis program, executing the stress analysis program, and determine a set of indications from the stress analysis program, each indication indicative of whether a respect schedule exceeds engineering limits of the tubing string (block 504); and providing at least some of the schedules to a fracture simulation program, executing the fracture simulation program, and determining a set of fracture geometries, each fracture geometry corresponding to a respective schedule (block 506). Thereafter, the method also ends automatically (block 508).

Some optimization algorithms are selected by the user, depending upon the number of parameters. The fracture optimization process is setup with a number of iterations, and the same time a specific object function or multiple object functions are selected such as maximizing net present value while minimizing fracture cost. A series of penalties and correction factors are added to create constraints in the optimization process. The management software will automatically stop when the object functions are maximized (minimized) honoring the constraints and minimizing the penalties function.

Figure 6:
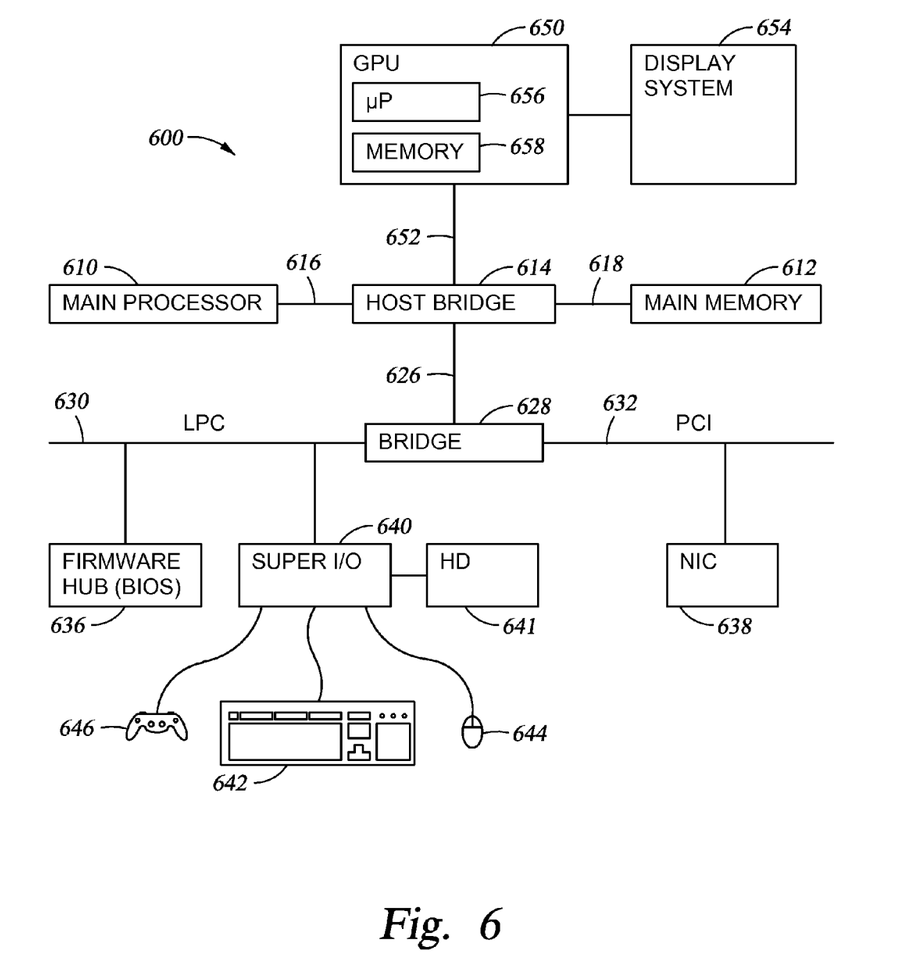
FIG. 6 shows a computer system in accordance with at least some embodiments.

FIG. 6 illustrates a computer system 600 in accordance with at least some embodiments, and upon which at least some of the various embodiments may be implemented. That is, some or all of the various embodiments may execute on a computer system such as shown in FIG. 6, multiple computers systems such as shown in FIG. 6, and/or one or more computer systems equivalent to the FIG. 6, including after-developed computer systems.

In particular, computer system 600 comprises a main processor 610 coupled to a main memory array 612, and various other peripheral computer system components, through integrated host bridge 614. The main processor 610 may be a single processor core device, or a processor implementing multiple processor cores. Furthermore, computer system 600 may implement multiple main processors 610. The main processor 610 couples to the host bridge 614 by way of a host bus 616 or the host bridge 614 may be integrated into the main processor 610. Thus, the computer system 600 may implement other bus configurations or bus-bridges in addition to, or in place of, those shown in FIG. 6.

The main memory 612 couples to the host bridge 614 through a memory bus 618. Thus, the host bridge 614 comprises a memory control unit that controls transactions to the main memory 612 by asserting control signals for memory accesses. In other embodiments, the main processor 610 directly implements a memory control unit, and the main memory 612 may couple directly to the main processor 610. The main memory 612 functions as the working memory for the main processor 610 and comprises a memory device or array of memory devices in which programs, instructions and data are stored. The main memory 612 may comprise any suitable type of memory such as dynamic random access memory (DRAM) or any of the various types of DRAM devices such as synchronous DRAM (SDRAM) (including double data rate (DDR) SDRAM, double-data-rate two (DDR2) SDRAM, double-data-rate three (DDR3) SDRAM), extended data output DRAM (EDODRAM), or Rambus DRAM (RDRAM). The main memory 612 is an example of a non-transitory computer-readable medium storing programs and instructions, and other examples are disk drives and flash memory devices.

The illustrative computer system 600 also comprises a second bridge 628 that bridges the primary expansion bus 626 to various secondary expansion buses, such as a low pin count (LPC) bus 630 and peripheral components interconnect (PCI) bus 632. Various other secondary expansion buses may be supported by the bridge device 628. In accordance with some embodiments, the bridge device 628 comprises an Input/Output Controller Hub (ICH) manufactured by Intel Corporation, and thus the primary expansion bus 626 comprises a Hub-link bus, which is a proprietary bus of the Intel Corporation. However, computer system 600 is not limited to any particular chip set manufacturer, and thus bridge devices and expansion bus protocols from other manufacturers may be equivalently used.

Firmware hub 636 couples to the bridge device 628 by way of the LPC bus 630. The firmware hub 636 comprises read-only memory (ROM) which contains software programs executable by the main processor 610. The software programs comprise programs executed during and just after POST.

The computer system 600 further comprises a network interface card (NIC) 638 illustratively coupled to the PCI bus 632. The NIC 638 acts as to couple the computer system 600 to a communication network, such the Internet.

Still referring to FIG. 6, computer system 600 may further comprise a super input/output (I/O) controller 640 coupled to the bridge 628 by way of the LPC bus 630. The Super I/O controller 640 controls many computer system functions, for example interfacing with various input and output devices such as a keyboard 642, a pointing device 644 (e.g., mouse), game controller 646, various serial ports, floppy drives and hard disk drives (HD) 641. The hard disk drive 641 is another example of a computer-readable media. In other cases, the hard disk drive 641 may couple to a separate drive controller coupled to a more powerful expansion bus, such as the PCI bus 632, particularly in cases where the hard disk drive is implemented as an array of drives (e.g., redundant array of independent (or inexpensive) disks (RAID)). In cases where the computer system 600 is a server computer system, the keyboard 642, pointing device 644 and game controller 646 may be omitted.

The computer system 600 further comprises a graphics processing unit (GPU) 650 coupled to the host bridge 614 by way of bus 652, such as a PCI Express (PCI-E) bus or Advanced Graphics Processing (AGP) bus. Other bus systems, including after-developed bus systems, may be equivalently used. Moreover, the graphics processing unit 650 may alternatively couple to the primary expansion bus 626, or one of the secondary expansion buses (e.g., PCI bus 632). The graphics processing unit 650 couples to a display system 654 which may comprise any suitable electronic display device or multiple distinct display devices, upon which any image or text can be displayed. The graphics processing unit 650 comprises an onboard processor 656, as well as onboard memory 658. The processor 656 may thus perform graphics processing, as commanded by the main processor 610. Moreover, the memory 658 may be significant, on the order of several hundred gigabytes or more. Thus, once commanded by the main processor 610, the graphics processing unit 650 may perform significant calculations regarding graphics to be displayed on the display system, and ultimately display such graphics, without further input or assistance of the main processor 610. In some case, such as the computer system 600 operated as server computer system, the graphics processing unit 650 and display system 654 may be omitted.

From the description provided herein, those skilled in the art are readily able to combine software created as described with appropriate general-purpose or special-purpose computer hardware to create a computer system and/or computer sub-components in accordance with the various embodiments, to create a computer system and/or computer sub-components for carrying out the methods of the various embodiments, and/or to create a non-transitory computer-readable storage medium (i.e., other than an signal traveling along a conductor or carrier wave) for storing a software program to implement the method aspects of the various embodiments.

The above discussion is meant to be illustrative of the principles and various embodiments of the present invention. Numerous variations and modifications will become apparent to those skilled in the art once the above disclosure is fully appreciated. For example, while many commercially available programs are noted in the specification, the various embodiments are not limited to just commercially available programs. Many companies have "in-house" or proprietary programs that perform a specific individual task or tasks, and incorporating such proprietary programs into the workflow is contemplated. It is intended that the following claims be interpreted to embrace all such variations and modifications.

What is claimed is:

1. A method comprising:

determining, by a computer system, a set of viable hydraulic fracture scenarios for a plurality of fracture zones planned for a single borehole in an underground formation, the determining by:

providing log data and parameters regarding hydraulic fracturing, the providing to a fracture planning program;

providing the log data to a fracture simulation program;

providing information regarding a tubing string to a stress analysis program;

providing information regarding the underground formation to an inflow performance relationship (IPR) analysis program;

providing data regarding the underground formation to a reservoir modeling program;

providing data regarding expected future prices per unit to a financial analysis program;

starting a management software by a user, the management software executes the fracture planning program, the fracture simulation program, the stress analysis program, the IPR analysis program, the reservoir modeling program; and the management software:

determines viable hydraulic fracture scenarios from a plurality of hydraulic fracture scenarios, and makes available the set of viable hydraulic fracture scenarios, and produces: a set of expected initial hydrocarbon production flows, each expected initial hydrocarbon production flow corresponding to a respective hydraulic fracture scenario in the set of viable hydraulic fracture scenarios; a set of expected hydrocarbon production flows over time, each expected hydrocarbon production flow over time corresponding to a respective initial hydrocarbon flow in the set of expected initial hydrocarbon flows; and produces a set of indications of financial viability, each indication of financial viability corresponding to a respective expected hydrocarbon production flow in the set of expected hydrocarbon production flows over time.

2. The method of claim 1 wherein the each indication of financial viability in the set of indications of financial viability is at least one selected from the group consisting of: net present value; return on investment.

3. A computer system comprising:

a processor; and a memory coupled to the processor;

wherein the memory stores a program that, when executed by the processor, causes the processor to:

execute a fracture planning program, and determine, for a plurality of fracture zones planned for a single borehole, a set of schedules from the fracture planning program, each schedule comprising a volume of fracture fluid, amount of proppant, and flow rate of the fracture fluid;

provide each schedule of the set of schedules to a tubing string stress analysis program, execute the stress analysis program, and determine a set of indications from the stress analysis program, each indication indicative of whether a respect schedule exceeds engineering limits of the tubing string; and provide at least some of the schedules to a fracture simulation program, execute the fracture simulation program, and determine a set of fracture geometries, each fracture geometry corresponding to a respective schedule;

provide at least some fracture geometries from the set of fracture geometries to an inflow performance relationship (IPR) analysis program;

execute the IPR analysis program;

determine a set of initial hydrocarbon flow from the IPR analysis program, each initial hydrocarbon flow of the set of initial hydrocarbon flows corresponding to a respective fracture geometry;

provide at least some of the initial hydrocarbon flows of the set of initial hydrocarbon flows to a reservoir modeling program;

execute the reservoir modeling program;

determine a set of expected time-based hydrocarbon flows from the reservoir modeling program, each expected time-based hydrocarbon flow of the set of expected time-based hydrocarbon flows corresponding to a respective initial hydrocarbon flow of the set of initial hydrocarbon flows;

provide at least some of the expected time-based hydrocarbon flows of the set of expected time-based hydrocarbon flows to a financial analysis program;

execute the financial analysis program; and determine a set of indications of financial viability from the financial analysis program, each indication of financial viability of the set of indications of financial viability corresponding to a respective expected time-based hydrocarbon flow of the set of expected time-based hydrocarbon flows.

4. The computer system of claim 3 wherein when the processor provides at least some of the schedules to the fracture simulation program, the program further causes the processor to provide schedules that have respective indications that the engineering limits would not be exceeded by performance of a fracture using parameters of the schedules.

5. The computer system of claim 3 wherein when the processor produces the set of indications of financial viability, the program further causes the processor to produce at least one selected from the group consisting of: net present value; and return on investment.

6. A non-transitory computer-readable media storing a program that, when executed by the processor, causes the processor to:

execute a fracture planning program, and determine for a plurality of fracture zones planned for a single borehole, a set of schedules from the fracture planning program, each schedule comprising a volume of fracture fluid, amount of proppant, and flow rate of the fracture fluid;

provide each schedule of the set of schedules to a stress analysis program, execute the stress analysis program, and determine a set of indications from the stress analysis program, each indication indicative of whether a respect schedule exceeds engineering limits of a tubing string; and provide at least some of the schedules to a fracture simulation program, execute the fracture simulation program, and determine a set of fracture geometries from the fracture simulation program, each fracture geometry corresponding to a respective schedule;

provide at least some fracture geometries from the set of fracture geometries to an inflow performance relationship (IPR) analysis program;

execute the IPR analysis program;

determining a set of initial hydrocarbon flows from the IPR analysis program, each initial hydrocarbon flow of the set of initial hydrocarbon flows corresponding to a respective fracture geometry;

provide at least some of the initial hydrocarbon flows of the set of initial hydrocarbon flows to a reservoir modeling program;

execute the reservoir modeling program;

determine a set of expected time-based hydrocarbon flows from the reservoir modeling program, each expected time-based hydrocarbon flow of the set of expected time-based hydrocarbon flows corresponding to a respective initial hydrocarbon flow of the set of initial hydrocarbon flows;

provide at least some of the expected time-based hydrocarbon flows of the set of expected time-based hydrocarbon flows to a financial analysis program;

execute the financial analysis program; and determine a set of indications of financial viability from the financial analysis program, each indication of financial viability of the set of indications of financial viability corresponding to a respective expected time-based hydrocarbon flow of the set of expected time-based hydrocarbon flows.

7. The non-transitory computer-readable media of claim 6 wherein when the processor provides the at least some schedules, the program further causes the processor to provide schedules that have respective indications that the engineering limits are not exceeded.

8. The non-transitory computer-readable media of claim 6 wherein when the processor produces the set of indications of financial viability, the program further causes the processor to produce at least one selected from the group consisting of: net present value; and return on investment.

* * * * *